US012750028B2

(12) United States Patent
Park

(10) Patent No.: US 12,750,028 B2
(45) Date of Patent: Sep. 29, 2026

(54) APPARATUS AND METHOD FOR SUPPLYING POWER

(71) Applicant: ASE Co., Ltd., Pyeongtaek-si (KR)

(72) Inventor: Hyoung Yeal Park, Suwon-si (KR)

(73) Assignee: ASE CO., LTD. (KR)

( * ) Notice: Subject to any disclaimer, the term of this patent is extended or adjusted under 35 U.S.C. 154(b) by 0 days.

(21) Appl. No.: 19/021,093

(22) Filed: Jan. 14, 2025

(65) Prior Publication Data

US 2026/0039269 A1 Feb. 5, 2026

(30) Foreign Application Priority Data

Jul. 31, 2024 (KR) ........................ 10-2024-0101734

(51) Int. Cl.
*H03H 7/38* (2006.01)

(52) U.S. Cl.
CPC ..................................... *H03H 7/38* (2013.01)

(58) Field of Classification Search
None
See application file for complete search history.

(56) References Cited

U.S. PATENT DOCUMENTS

2006/0057854 A1 3/2006 Setsuhara et al.
2008/0158927 A1* 7/2008 Omae ............... H01J 37/32174 363/165
2014/0145636 A1 5/2014 Merte
2019/0267213 A1* 8/2019 Leray ................ H01J 37/32155
2021/0057188 A1* 2/2021 Ni ............................ H03H 7/40

FOREIGN PATENT DOCUMENTS

KR 102035620 B1 10/2019
KR 20220056469 A 5/2022

* cited by examiner

*Primary Examiner* — Daniel C Puentes
*Assistant Examiner* — Aqeel H Bukhari
(74) *Attorney, Agent, or Firm* — Renaissance IP Law Group LLP

(57) ABSTRACT

In accordance with an exemplary embodiment of the present disclosure, there is provided an apparatus for supplying power which is an apparatus for supplying power to a plurality of loads and includes a plurality of signal generation units each capable of generating a power signal input to each of the plurality of loads, a plurality of variable frequency oscillation units each capable of generating a variable frequency signal input to each of the plurality of signal generation units, a reference frequency oscillation unit that capable of generates a reference frequency signal commonly input to the plurality of signal generation units, and a plurality of control units each capable of connecting each of the plurality of variable frequency oscillation units to each of the plurality of signal generation units or connecting the reference frequency oscillation unit to each of the plurality of signal generation units.

9 Claims, 2 Drawing Sheets

APPARATUS AND METHOD FOR SUPPLYING POWER

CROSS-REFERENCE TO RELATED APPLICATION

This application claims priority to Korean Patent Application No. 10-2024-0101734 filed on Jul. 31, 2024, and all the benefits accruing therefrom under 35 U.S.C. § 119, the contents of which are incorporated by reference in their entirety.

BACKGROUND

The present disclosure relates to an apparatus and method for supplying power, and more specifically, to an apparatus and method for supplying power to a plurality of loads.

A plasma processing device for semiconductor manufacturing includes a processing device capable of performing various processing using plasma. The processing device is used in various ways, for example, in such as etching, deposition, cleaning, and ashing processes, and receives a power signal from an apparatus for supplying power to form and maintain plasma in a reaction space.

The apparatus for supplying power may supply power to a plurality of loads included in the processing device in order to make the density of plasma uniform or improve the productivity of a product. For example, the processing device includes a plurality of divided electrodes, and a power signal can be supplied to each of the divided electrodes. In addition, the processing device has a plurality of reaction spaces in order to respectively process a plurality of substrates and a power signal can be supplied to each of the electrodes provided in the plurality of divided reaction spaces.

As such, when supplying power signals to a plurality of loads, impedance matching needs to be performed to minimize reflected wave transmitted from the plurality of loads. Such impedance matching should be performed quickly to secure process reliability and improve productivity. In addition, the power signals supplied to the plurality of loads after impedance matching should have the same frequency. If power signals with different frequencies are supplied to the plurality of loads, noise is generated due to mutual interference, that is, crosstalk, causing a problem in which plasma cannot be formed stably.

Examples of related art include KR 10-2022-0056469 A.

SUMMARY

The present disclosure provides an apparatus and method for supplying power capable of quickly matching impedance and supplying power signals having the same frequency to a plurality of loads.

In accordance with an exemplary embodiment of the present disclosure, there is provided an apparatus for supplying power which is an apparatus for supplying power for supplying power to a plurality of loads and includes a plurality of signal generation units each capable of generating a power signal input to each of the plurality of loads, a plurality of variable frequency oscillation units each capable of generating a variable frequency signal input to each of the plurality of signal generation units, a reference frequency oscillation unit capable of generating a reference frequency signal commonly input to the plurality of signal generation units, and a plurality of control units each capable of connecting each of the plurality of variable frequency oscillation units to each of the plurality of signal generation units or connecting the reference frequency oscillation unit to each of the plurality of signal generation units.

The apparatus for supplying power may further include a plurality of matching units each capable of matching impedance between each of the plurality of signal generation units and each of the plurality of loads.

Each signal generation unit may include a signal amplifier capable of generating a power signal by amplifying a variable frequency signal or a reference frequency signal input from each variable frequency oscillation unit or the reference frequency oscillation unit.

Each control unit may include a switching element capable of selectively connecting each variable frequency oscillation units or the reference frequency oscillation unit to each of the signal generation units.

Each control unit may connect each of the variable frequency oscillation units to each of the signal generation unit to match impedance between each of the signal generation units and each of the loads, and then connect the reference frequency oscillation unit to each of the signal generation units.

In accordance with another exemplary embodiment of the present disclosure, there is provided a method for supplying power which is a method for supplying power to a plurality of loads and includes a process of primarily matching impedance between a plurality of signal generation units and a plurality of loads by inputting each of variable frequency signals generated from a plurality of variable frequency oscillation units to each of the plurality of signal generation units and adjusting a frequency, a process of secondarily matching impedance between each of the plurality of signal generation units and each of the plurality of loads while changing the adjusted frequency to a reference frequency when the adjusted frequency is different from the reference frequency after primarily matching the impedance, and a process of generating a power signal input to the plurality of loads by inputting the reference frequency signal generated from a common reference frequency oscillation unit to the plurality of signal generation units.

The process of primarily matching the impedance includes a process of generating variable frequency signals having a set frequency from the plurality of variable frequency oscillation units, inputting each of the variable frequency signals to each of the plurality of signal generation units, and detecting each of reflected waves transmitted from the plurality of loads, and a process of adjusting a frequency of the variable frequency signal generated from each of the plurality of variable frequency oscillation units so that each of the reflected waves transmitted from the plurality of loads is minimized.

The process of secondarily matching the impedance may include a process of setting a frequency of the variable frequency signal adjusted so that each of the reflected waves transmitted from the plurality of loads is minimized to a provisional matching frequency, and a process of generating a variable frequency signal having a temporary frequency between the provisional matching frequency and the reference frequency from each of the plurality of variable frequency oscillation units and inputting the variable frequency signal to each of the plurality of signal generation units, and matching an impedance between the plurality of signal generation units and the plurality of loads so that each of reflected waves transmitted from the plurality of loads is minimized.

The process of matching the impedance may include a process of generating a variable frequency signal having a new temporary frequency between the temporary frequency and the reference frequency and inputting the variable frequency signal to each of the plurality of signal generation units when a frequency difference between the temporary frequency and the reference frequency exceeds a set threshold, and re-matching the impedance between the plurality of signal generation units and the plurality of loads so that each of the reflected waves transmitted from the plurality of loads is minimized, and the process of re-matching the impedance may be repeatedly performed until the frequency difference between the new temporary frequency and the reference frequency becomes less than or equal to the set threshold.

The process of primarily matching the impedance and the process of secondarily matching the impedance may be performed by respectively connecting the plurality of variable frequency oscillation units to the plurality of signal generation units, and the process of generating the power signal may be performed by respectively disconnecting the plurality of variable frequency oscillation units from the plurality of signal generation units, and commonly connecting the reference frequency oscillation unit to the plurality of signal generation units.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
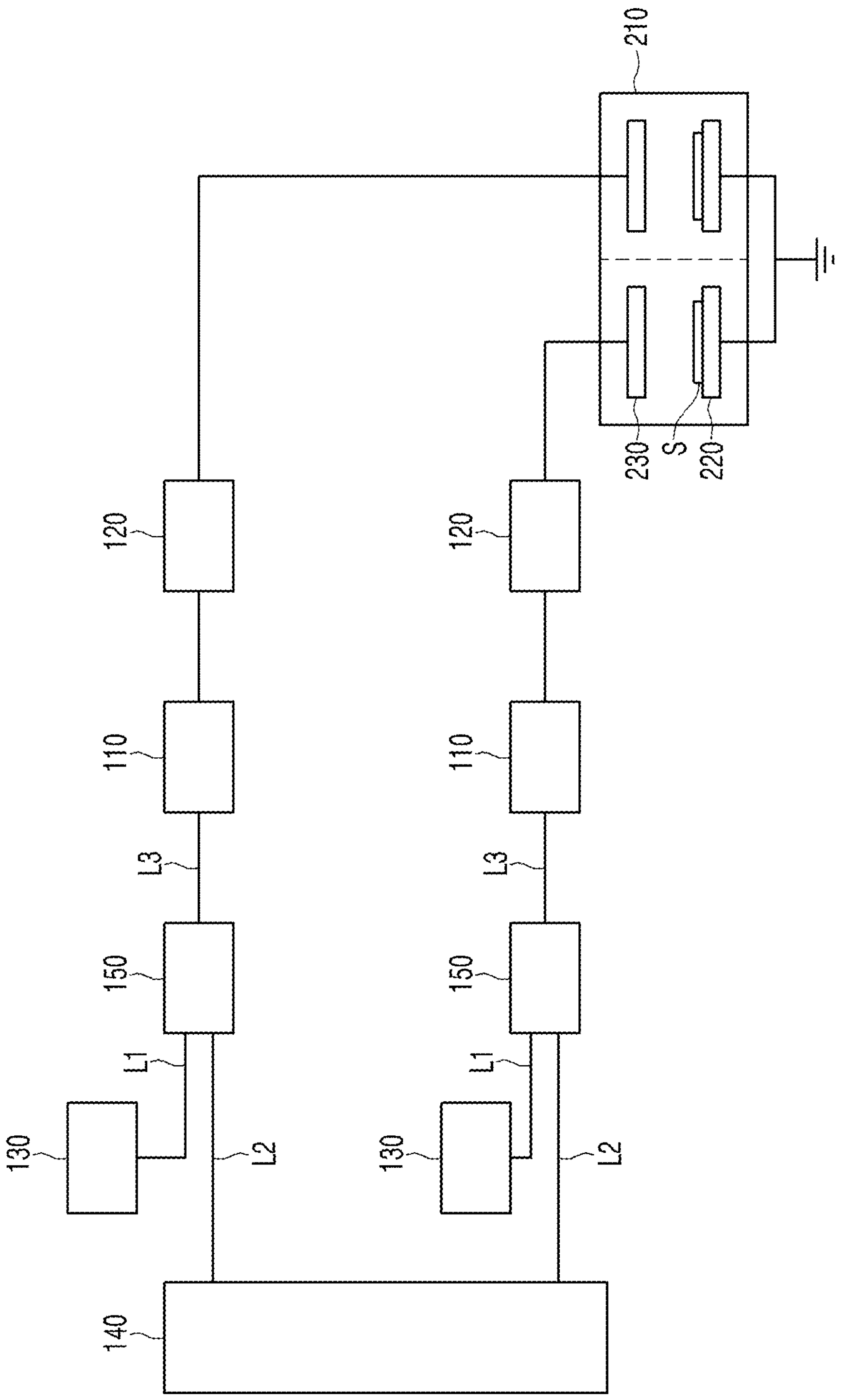
FIG. 1 is a diagram schematically showing an apparatus for supplying power in accordance with an exemplary embodiment.

Hereinafter, embodiments of the present disclosure will be described in detail with reference to the accompanying diagrams. However, the present disclosure is not limited to the embodiments disclosed below, but may be implemented in various different forms, and the embodiments of the present disclosure are provided only to make the disclosure of the present disclosure complete and to fully inform those skilled in the art of the scope of the inventive concept. In order to describe the inventive concept in detail, the drawings may be exaggerated, and like reference numerals refer to like elements in the drawings.

Figure 2:
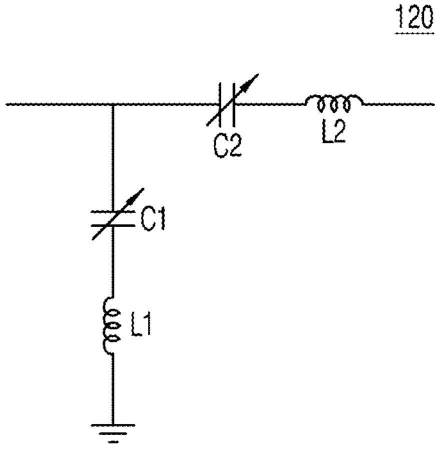
FIG. 2 is a diagram schematically showing a structure of a matching unit in accordance with another exemplary embodiment.

FIG. 1 is a diagram schematically showing an apparatus for supplying power according to an embodiment of the present disclosure, and FIG. 2 is a diagram schematically showing a structure of a matching unit according to an embodiment of the present disclosure. In addition, FIG. 3 is a diagram schematically showing a state in which a control unit operates according to an embodiment of the present inventive concept.

Referring to FIGS. 1 to 3*b*, an apparatus for supplying power according to an embodiment of the present disclosure is an apparatus for supplying power for supplying power to a plurality of loads 230, and includes a plurality of signal generation units 110 each capable of generating a power signal input to each of the plurality of loads 230, a plurality of variable frequency oscillation units 130 each capable of generating a variable frequency signal input to each of the plurality of signal generation units 110, a reference frequency oscillation unit 140 capable of generating a reference frequency signal commonly input to the plurality of signal generation units 110, and a plurality of control units 150 each capable of connecting each of the plurality of variable frequency oscillation units 130 to each of the plurality of signal generation units 110 or capable of connecting the reference frequency oscillation unit 140 to each of the plurality of signal generation units 110. In addition, the apparatus for supplying power according to the embodiment of the present disclosure may further include a plurality of matching units 120 each capable of matching impedance between each of the plurality of signal generation units 110 and each of the plurality of loads 230. In describing the embodiment of the present disclosure, connection means including both wired connection and wireless connection for transmitting electrical signals.

The signal generation unit 110 may generate a power signal input to the plurality of loads 230. Here, the power signal may include a radio frequency (RF) signal. A plurality of signal generation units 110 are provided to generate power signals that are respectively input to the plurality of loads 230. For example, the same number of signal generation units 110 as the number of loads may be provided. That is, as shown in FIG. 1, when generating power signals input to two loads 230, two signal generation units 110 may be provided to generate power signals that respectively input to the two loads 230. However, it goes without saying that the signal generation unit 110 and the load 230 may be provided in a variety of numbers of three or more.

The signal generation unit 110 may receive a variable frequency signal or a reference frequency signal from a variable frequency oscillation unit 130 or a reference frequency oscillation unit 140 described below, and may generate a power signal by amplifying the input variable frequency signal or the reference frequency signal. To this end, the signal generation unit 110 may include a signal amplifier that may generate the power signal by amplifying the input variable frequency signal or the reference frequency signal.

The matching unit 120 matches impedance between the signal generation unit 110 and the load 230 to minimize the reflection due to an impedance difference. That is, the matching unit 120 may detect a reflected wave transmitted from the load 230 to the signal generation unit 110 and match the impedance so that the reflected wave is minimized. Such a matching unit 120 may include a standard L-type matching circuit in which two variable elements are connected in series and in parallel, as shown in FIG. 2. Here, the matching unit 120 may match the impedance by changing impedance of the variable element, more specifically, capacitive reactance or inductive reactance. Impedance matching through such a matching circuit is a widely known technology, and a detailed description thereof will be omitted. In addition, although FIG. 2 illustrates an embodiment of matching the impedance by changing the capacitance of a parallel variable capacitor C1 and a series variable capacitor C2, it goes without saying that the impedance may be matched by changing the inductance of a parallel inductor L1 and a series inductor L2, and the matching unit 120 may also include various matching circuits capable of matching the impedance between the signal generation unit 110 and the load in addition to the standard L type.

A plurality of matching units 120 are provided so that impedance between each of a plurality of signal generation units 110 and each of the plurality of loads 230 is matched. For example, the matching unit 120 may be provided in the same number as the loads, like the signal generation unit 110. That is, as shown in FIG. 1, when generating power signals input to two signal generation units 110 and two loads 230, two signal generation units 110 may be provided to generate power signals each input to each of the two loads 230. However, it goes without saying that the matching unit 120 may be provided in various numbers depending on the number of loads 230.

The variable frequency oscillation unit 130 may generate a variable frequency signal input to the signal generation unit 110.

As an impedance matching method, a method of adjusting the reactance of a variable element by the matching unit 120 described above is generally used. In this method, impedance matching can be performed in a wide range, and thus an excellent impedance matching function can be performed and a reflected wave can be implemented close to "0". However, the variable element is controlled using a motor, and the matching time takes from several hundred milliseconds to several seconds depending on the driving speed of the motor.

As a different impedance matching method, a method of matching impedance by varying the frequency is also used. This method is a method of matching impedance by varying the frequency of the power signal input to the load 230 so that the reflected wave is minimized, and has the advantage of having a very short matching time of several microseconds to several milliseconds. However, in the method of varying the frequency, a variable range of frequency is small, and thus a range in which impedance matching is possible is small, and even after matching is completed, a certain amount of reflected wave remains.

In the apparatus for supplying power according to the embodiment of the present disclosure, the matching unit 120 and the variable frequency oscillator 130 are included, and the impedance matching method through the matching unit 120 and the impedance matching method through frequency variation are mixed to match the impedance so that the reflected wave is minimized within a short period of time. This impedance matching method will be described below in relation to the method for supplying power according to the embodiment of the present disclosure.

The variable frequency oscillation unit 130 may generate a variable frequency signal. That is, the variable frequency oscillation unit 130 generates the variable frequency signal whose frequency can be changed, and the signal generation unit 110 receives the variable frequency signal from the variable frequency oscillation unit 130 and amplifies the variable frequency signal to generate a power signal. This variable frequency oscillation unit may use, for example, a local oscillation unit LO or a digital synthesis type oscillation unit. Here, the digital synthesis type oscillation unit may generate a digital signal representing a frequency set by a direct digital synthesis (DDS) method and convert the digital signal into an analog signal to generate a variable frequency signal. As such, the variable frequency oscillation unit 130 that generates the variable frequency may use various known oscillators, and thus a detailed description thereof will be omitted.

A plurality of variable frequency oscillator units 130 are provided so as to generate variable frequency signals that are respectively input to the plurality of signal generation units 110. For example, the variable frequency oscillation unit 130 may be provided in the same number as the load, like the signal generation unit 110, and as described above, may be provided in various numbers of two or three or more.

The reference frequency oscillation unit 140 may generate a reference frequency signal. Here, the reference frequency is a target frequency of power supply, and means a frequency value of the power signal that should be finally provided to the load 230 in a state where impedance matching is completed, and refers to the frequency most suitable for a process recipe in a process that proceeds through the load 230. This reference frequency oscillation unit may also use various types of oscillators, such as a local oscillator or a digital synthesis type oscillator.

The reference frequency oscillation unit 140 generates the reference frequency signal that is commonly input to the plurality of signal generation units 110. The reference frequency generation unit 140 of this type may be provided singly to generate a single reference frequency signal that is distributed and supplied to the plurality of signal generation units 110. In this case, in restoring the frequency to the reference frequency after performing impedance matching, the reference frequency oscillation unit 140 serves to minimize noise generation due to mutual interference by supplying power signals having the same reference frequency, that is, target frequency, to the plurality of loads 230.

The control unit 150 is provided in a plurality of units so that the plurality of variable frequency oscillation units 130 can be respectively connected to the plurality of signal generation units 110, or a single reference frequency oscillation unit 140 can be connected to each of the plurality of signal generation units 110. That is, the control unit 150 can be provided in the same number as the load, like the signal generation unit 110, or can be provided in various numbers of two or three or more, as described above.

Figure 3A:
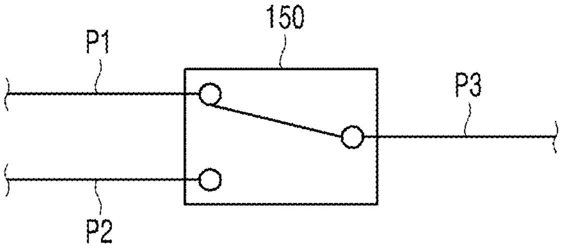
FIGS. 3*a* and 3*b* are diagrams schematically showing a state in which a control unit operates in accordance with still another exemplary embodiment.
Figure 3B:
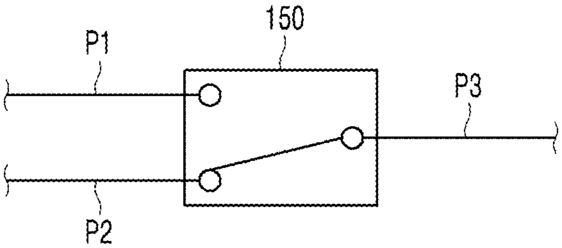

The control unit 150 may include a switching element that can selectively connect the variable frequency oscillation unit 130 or the reference frequency oscillation unit 140 to the signal generation unit 110. Here, the control unit 150 first connects the variable frequency oscillation unit 130 to the signal generation unit 110 to match the impedance between the signal generation unit 110 and the load 230, and then, when the impedance matching is completed, the control unit 150 connects the reference frequency oscillation unit 140 to the signal generation unit 110 to supply a power signal having a reference frequency to the load 230. In this case, the switching element may perform impedance matching by connecting an output line P1 of the variable frequency oscillation unit 130 to an input line P3 of the signal generation unit 110 as shown in FIG. 3*a*, and when the impedance matching is completed, the switching element may supply a power signal having a reference frequency to the load 230 by connecting an output line P2 of the reference frequency oscillation unit 140 to the input line P3 of the signal generation unit 110, as shown in of FIG. 3*b*.

The processing device may receive the power signal and generate plasma in the reaction space. Here, the processing device has a reaction space and may be connected to the apparatus for supplying power so as to receive the power signal and generate plasma in the reaction space. Such a processing device may include a chamber 210, a substrate support unit 220, and a gas supply unit.

The chamber 210 provides a predetermined reaction space and keeps the reaction space airtight. The chamber 210 may include a body having a predetermined reaction space, including a substantially circular or square flat portion and a side wall extending upward from the flat part and a side wall extending upward from the flat portion, and a cover positioned on the body in a substantially circular or square shape to keep the chamber airtight. However, the chamber 210 is not limited thereto and may be manufactured in various shapes corresponding to a shape of a substrate S.

In this case, a plurality of reaction spaces may be provided. That is, the chamber 210 may include a plurality of reactors that provide reaction spaces, respectively, so that a plurality of substrates S can be individually processed to improve productivity. The drawing shows an example in which two reaction spaces are provided, but it is obvious that reaction spaces may be provided in various numbers of four reaction spaces.

The substrate S provided in the chamber 210 may be seated on the substrate support unit 220 for plasma processing. Here, the substrate S may include various substrates such as a wafer, a glass substrate, or a plastic substrate. The substrate support unit 220 may be grounded and may act as a lower electrode when forming plasma in the reaction space. Such a substrate support unit 220 may be divided into a plurality of parts to support a large-area substrate S, or, a plurality of substrate support units 220 may be provided to be respectively installed in a plurality of reaction spaces when the chamber 210 provides the reaction spaces.

The gas supply unit may correspond to the load 230 described above. The gas supply unit may be provided, for example, on an upper side inside the chamber 210 and injects process gas into the reaction space. For example, the gas supply unit may include a shower head having an upper side connected to a gas supply line (not shown) and a lower side formed with a plurality of fine injection holes for injecting process gas onto the substrate S. When forming plasma in the reaction space, the gas supply unit may act as an upper electrode by receiving a power signal. Such a gas supply unit may be provided by being divided into a plurality of parts to inject process gas onto the large-area substrate S. Alternatively, when the chamber 210 provides a plurality of reaction spaces, the gas supply unit may be provided in a plurality of parts so that each gas supply unit faces the substrate support unit 220.

As such, when the electrode is divided into a plurality of electrodes in the processor 200, or when a plurality of reaction spaces are provided so that electrodes are respectively disposed therein, the power signal supplied to the gas supply unit should have the same frequency in order to stably form plasma. In the embodiment of the present disclosure, the variable frequency oscillation unit 130 is first connected to the signal generation unit 110 to match the impedance between the signal generation unit 110 and the load 230 through the control unit 150, and then when the impedance matching is completed, the reference frequency oscillation unit 140 is connected to the signal generation unit 110 to supply the power signal having the same reference frequency to the load 230, thereby capable of minimizing mutual interference.

Hereinafter, a method for supplying power according to an embodiment of the present disclosure will be described. The method for supplying power according to the embodiment of the present disclosure may be a method for supplying power to the processing device using the apparatus for supplying power described above, and thus the content described above in relation to the apparatus for supplying power may be applied as is, and therefore the description of redundant content will be omitted.

The method for supplying power according to the embodiment of the present disclosure is a method for supplying power for supplying power to the plurality of loads 230, and includes a process of primarily matching impedance between the plurality of signal generation units 110 and the plurality of loads 230 by inputting each of variable frequency signals generated from a plurality of variable frequency oscillation units 130 to each of the plurality of signal generation units 110 and adjusting a frequency, a process of secondarily matching impedance between each of the plurality of signal generation units 110 and each of the plurality of loads 230 while changing the adjusted frequency to a reference frequency when the adjusted frequency is different from the reference frequency after primarily matching the impedance, and a process of generating a power signal input to the plurality of loads 230 by inputting the reference frequency signal generated from the common reference frequency oscillation unit 140 to the plurality of signal generation units 110.

In the process of primarily matching the impedance, each of variable frequency signals generated from the plurality of variable frequency oscillation units 130 is input to each of the plurality of signal generation units 110 and the frequency is adjusted to primarily match the impedance between each of the plurality of signal generation units 110 and each of the plurality of loads 230. To this end, the process of primarily matching the impedance includes a process of generating variable frequency signals having a set frequency from the plurality of variable frequency oscillation units 130, inputting each of the variable frequency signals to each of the plurality of signal generation units 110, and detecting each of reflected waves transmitted from the plurality of loads 230, and a process of adjusting a frequency of the variable frequency signal generated from each of the plurality of variable frequency oscillation units 130 so that each of the reflected wave transmitted from the plurality of loads 230 is minimized.

The process of primarily matching impedance is performed while the variable frequency oscillation unit 130 and the signal generation unit 110 are connected to each other through the control unit 150. In this case, the reference frequency oscillation unit 150 and the signal generation unit 110 are not connected to each other.

In the process of detecting the reflected wave, a variable frequency signal having a set frequency is generated from the plurality of variable frequency oscillation units 130 first and the variable frequency signal is input to each of the plurality of signal generation units 110. For example, the variable frequency signal initially input to the plurality of signal generation units 110 may be set within a range of ±10% of a reference frequency, that is, a target frequency. Thereafter, the reflected waves transmitted from the plurality of loads 230 is detected.

In the process of adjusting the frequency of the variable frequency signal generated from each of the plurality of variable frequency oscillation units 130, the frequency of the variable frequency signal generated from each of the plurality of variable frequency oscillation units 130 is adjusted so that the reflected wave is minimized. For example, it is checked whether a reflection coefficient of the reflected wave is less than or equal to a first set value, and if the reflection coefficient exceeds the first set value, the frequency of the variable frequency signal is changed to adjust so that the reflection coefficient of the reflected wave is less than or equal to the first set value. As such, in the process of primarily matching the impedance, the matching unit 120 described above may stop functioning, so that the reactance of the variable element may not change.

In the process of secondarily matching impedance, if the adjusted frequency is different from the reference frequency after the impedance is primarily matched, the impedance is secondarily matched between the plurality of signal generation units 110 and the plurality of loads 230 while each of the adjusted frequencies is changed to the reference frequency. To this end, the process of secondarily matching the impedance may include a process of setting a frequency of the variable frequency signal adjusted so that each of the reflected wave transmitted from the plurality of loads 230 is minimized to a provisional matching frequency, and a process of generating a variable frequency signal having a temporary frequency between the provisional matching frequency and the reference frequency from each of the plurality of variable frequency oscillation units 130 and inputting the variable frequency signal to each of the plurality of signal generation units 110, and matching the impedance between the plurality of signal generation units 110 and the plurality of loads 230 so that each of reflected waves transmitted from the plurality of loads 230 is minimized.

This process of secondary matching the impedance is also performed with the variable frequency oscillator 130 and the signal generator 110 connected to each other through the control unit 150. In this case, the reference frequency oscillation unit 150 and the signal generation unit 110 are not connected to each other.

In the process of setting the provisional matching frequency, the frequency of the variable frequency signal adjusted in the process of first matching the impedance is set as the provisional matching frequency. Here, the provisional matching frequency may mean the first matching frequency when matching the impedance by changing the frequency through the variable frequency oscillation unit 130.

After that, the variable frequency signal having a temporary frequency between the provisional matching frequency and the reference frequency is generated from the plurality of variable frequency oscillation units 130 and the variable frequency signal is inputted to each of the plurality of signal generation units 110, and the impedance is matched between the plurality of signal generation units 110 and the plurality of loads 230 so that each of the reflected waves transmitted from the plurality of loads 230 is minimized. Here, the temporary frequency means a frequency between the matching frequency and the reference frequency, and may be set arbitrarily. After inputting the variable frequency signal having such a temporary frequency to each of the plurality of signal generation units 110, the reflected wave transmitted from the plurality of loads 230 is detected, and it is checked whether the reflection coefficient of the reflected wave is less than or equal to a second set value. In this case, the second setting value may be the same as or different from the first setting value. If the reflection coefficient of the reflected wave exceeds the second set value, the matching unit 120 is operated to change the reactance of the variable element to minimize the reflected wave to perform impedance matching. The process of matching the impedance in this way may include a process of generating a variable frequency signal having a new temporary frequency between the temporary frequency and the reference frequency and inputting the variable frequency signal to each of the plurality of signal generation units when the frequency difference between the temporary frequency and the reference frequency exceeds a set threshold, and re-matching the impedance between the plurality of signal generation units and the plurality of loads so that each of the reflected waves transmitted from the plurality of loads is minimized. In this case, the process of re-matching the impedance may be repeatedly performed until the frequency difference between the new temporary frequency and the reference frequency becomes less than or equal to the set threshold.

For example, as for the temporary frequency, an interval between the matching frequency and the reference frequency is divided into several sections, and a value closest to the matching frequency becomes a first temporary frequency, and when impedance matching is completed by the first temporary frequency, a value next closest to the matching frequency becomes a new temporary frequency and impedance matching is repeated. This can be performed repeatedly until the frequency difference between the new temporary frequency and the reference frequency becomes less than or equal to the set threshold.

When performing the first impedance matching and the second impedance matching in this manner, the frequency of the variable frequency signal can be restored to a value similar to the reference frequency. However, due to the difference in a unique frequency of the matching unit 140 connected to each load 230, etc., the frequency of the variable frequency supplied to each load 230 may differ in a range of several Hertz (Hz) to several tens of kilohertz (kHz), which causes mutual interference.

Accordingly, in the embodiment of the present disclosure, after performing primary and secondary impedance matching, the reference frequency signal generated from the common reference frequency oscillation unit 140 is input to the plurality of signal generation units 110 to generate the power signal input to the plurality of loads.

In this way, the process of generating the power signal is performed in a state in which the variable frequency oscillation unit 130 and the signal generation unit 110 are disconnected from each other through the reference frequency oscillation unit 150 and the reference frequency oscillator 150 and the signal generation unit 110 are connected to each other. That is, the process of generating the power signal can be performed by disconnecting each of the plurality of variable frequency oscillation units 130 and each of the plurality of signal generation units 110 from each other and connecting the single reference frequency oscillation unit 140 in common to the plurality of signal generation units 110. In this way, in the embodiment of the present disclosure, the variable frequency oscillation unit 130 is first connected to the signal generation unit 110 through the control unit 150 to match the impedance between the signal generation unit 110 and the load 230, and then, when the impedance matching is completed, the reference frequency oscillation unit 140 is connected to the signal generation unit 110 to supply a power signal having the same reference frequency to the load 230, thereby capable of minimizing mutual interference.

According to an embodiment of the present disclosure, the impedance can be quickly matched by performing impedance matching in a frequency changing manner.

In addition, in restoring the frequency to the reference frequency after performing impedance matching, power signals having the same reference frequency can be supplied to a plurality of loads, and thus noise generation due to mutual interference can be minimized.

Although the apparatus and method for supplying power have been described with reference to the specific embodiments, they are not limited thereto. Therefore, it will be readily understood by those skilled in the art that various modifications and changes can be made thereto without departing from the spirit and scope of the present inventive concept defined by the appended claims.

Although the preferred embodiments of the present disclosure have been described and illustrated above using specific terms above, such terms are only intended to clearly describe the present disclosure, and it is obvious that the embodiments of the present disclosure and the described terms can be modified and changed in various ways without departing from the technical spirit and scope of the following claims. Such modified embodiments should not be understood individually from the spirit and scope of the present inventive concept, but should be considered to fall within the claims of the present inventive concept.

DESCRIPTION OF THE REFERENCE NUMERALS

110: signal generation unit
120: matching unit
130: variable frequency oscillation unit
140: reference frequency oscillation unit
150: control unit

What is claimed is:

1. An apparatus for supplying power to a plurality of loads, the apparatus comprising:

a plurality of signal generation units each generating a power signal input to each of the plurality of loads;

a plurality of variable frequency oscillation units each generating a variable frequency signal input to each of the plurality of signal generation units;

a reference frequency oscillation unit that generates a reference frequency signal commonly input to the plurality of signal generation units; and a plurality of control units each connecting each of the plurality of variable frequency oscillation units to each of the plurality of signal generation units or connecting the reference frequency oscillation unit to each of the plurality of signal generation units, wherein the reference frequency oscillation unit is configured to distribute the generated reference frequency signal to the plurality of signal generation units so as to input the distributed reference frequence signal, and each of the control units is configured to:

releases the connection between the reference frequency oscillation unit and the signal generation unit so that the reference frequency signal is not input to the signal generation unit when the variable frequency oscillation unit is connected to the signal generation unit, and release the connection between the variable frequency oscillation unit and the signal generation unit so that the variable frequency signal is not input to the signal generation unit when the reference frequency oscillation unit is connected to the signal generation unit.

2. The apparatus of claim 1, further comprising:

a plurality of matching units each matching impedance between each of the plurality of signal generation units and each of the plurality of loads.

3. The apparatus of claim 1, wherein each signal generation unit includes a signal amplifier that generates a power signal by amplifying a variable frequency signal or a reference frequency signal input from each variable frequency oscillation unit or the reference frequency oscillation unit.

4. The apparatus of claim 1, wherein each signal generation unit includes a switching element that selectively connects each variable frequency oscillation unit or the reference frequency oscillation unit to each of the signal generation units.

5. The apparatus of claim 1, wherein each control unit connects each of the variable frequency oscillation units to each of the signal generation units to match impedance between each of the signal generation units and each of the loads, and then connects the reference frequency oscillation unit to each of the signal generation units.

6. A method for supplying power to a plurality of loads, the method comprising:

a process of primarily matching impedance between a plurality of signal generation units and a plurality of loads by inputting each of variable frequency signals generated from a plurality of variable frequency oscillation units to each of the plurality of signal generation units and adjusting a frequency;

a process of secondarily matching impedance between each of the plurality of signal generation units and each of the plurality of loads while changing the adjusted frequency to a reference frequency when the adjusted frequency is different from the reference frequency after primarily matching the impedance; and a process of generating a power signal input to the plurality of loads by distributing and inputting the reference frequency signal generated from a common reference frequency oscillation unit to the plurality of signal generation units, wherein the process of primarily matching the impedance and the process of the secondarily matching the impedance are performed by connecting the variable frequency oscillation unit to the plurality of signal generation units and releasing the connection between the reference frequency oscillation unit and the plurality of signal generation units so that the reference frequency signal is not input to the plurality of signal generation units, and the process of generating the power signal is performed by connecting the reference frequency oscillator unit to the plurality of generation units and releasing the connection between the variable frequency oscillator units and the plurality of signal generation units so that the variable frequency signal is not input to the plurality of generation units.

7. The method of claim 6, wherein the process of primarily matching the impedance includes:

a process of generating variable frequency signals having a set frequency from the plurality of variable frequency oscillation units, inputting each of the variable frequency signals to each of the plurality of signal generation units, and detecting each of reflected waves transmitted from the plurality of loads; and a process of adjusting a frequency of the variable frequency signal generated from each of the plurality of variable frequency oscillation units so that each of the reflected waves transmitted from the plurality of loads is minimized.

8. The method of claim 7, wherein the process of secondarily matching the impedance includes:

a process of setting a frequency of the variable frequency signal adjusted so that each of the reflected waves transmitted from the plurality of loads is minimized to a provisional matching frequency; and a process of generating a variable frequency signal having a temporary frequency between the provisional matching frequency and the reference frequency from each of the plurality of variable frequency oscillation units and inputting the variable frequency signal to each of the plurality of signal generation units, and matching an impedance between the plurality of signal generation units and the plurality of loads so that each of reflected waves transmitted from the plurality of loads is minimized.

9. The method of claim 8, wherein the process of matching the impedance includes a process of generating a variable frequency signal having a new temporary frequency between the temporary frequency and the reference frequency and inputting the variable frequency signal to each of the plurality of signal generation units when a frequency difference between the temporary frequency and the reference frequency exceeds a set threshold, and re-matching the impedance between the plurality of signal generation units and the plurality of loads so that each of the reflected waves transmitted from the plurality of loads is minimized, and the process of re-matching the impedance is repeatedly performed until the frequency difference between the new temporary frequency and the reference frequency becomes less than or equal to the set threshold.

* * * * *